(12) United States Patent
Wagenleitner et al.

(10) Patent No.: US 12,745,600 B2
(45) Date of Patent: Sep. 22, 2026

(54) METHOD AND DEVICE FOR THE ALIGNMENT OF A SUBSTRATE

(71) Applicant: EV Group E. Thallner GmbH, St. Florian am Inn (AT)

(72) Inventors: Thomas Wagenleitner, St Florian am Inn (AT); Harald Rohringer, St. Florian am Inn (AT)

(73) Assignee: EV Group E. Thallner GmbH, St. Florian am Inn (AT)

( * ) Notice: Subject to any disclaimer, the term of this patent is extended or adjusted under 35 U.S.C. 154(b) by 51 days.

(21) Appl. No.: 18/720,209

(22) PCT Filed: Dec. 17, 2021

(86) PCT No.: PCT/EP2021/086374
§ 371 (c)(1),
(2) Date: Jun. 14, 2024

(87) PCT Pub. No.: WO2023/110113
PCT Pub. Date: Jun. 22, 2023

(65) Prior Publication Data
US 2025/0046639 A1 Feb. 6, 2025

(51) Int. Cl.
*H10P 72/50* (2026.01)
*H10W 46/00* (2026.01)

(52) U.S. Cl.
CPC ............ *H10P 72/53* (2026.01); *H10W 46/00* (2026.01); *H10W 46/301* (2026.01)

(58) Field of Classification Search
CPC ................ H01L 21/681; H01L 23/544; H01L 2223/54426; H10P 72/53; H10W 46/00; H10W 46/301; H10W 46/501
See application file for complete search history.

(56) References Cited

U.S. PATENT DOCUMENTS 5,843,831 A 12/1998 Chung et al.
6,214,692 B1 4/2001 Thallner
9,194,700 B2 11/2015 Kast et al.
9,418,882 B2 8/2016 Thallner
10,692,747 B2 6/2020 Wagenleitner et al.
10,943,807 B2 3/2021 Wagenleitner et al.
11,488,851 B2 11/2022 Wagenleitner et al.
11,605,550 B2 3/2023 Yang et al.
2013/0162997 A1 6/2013 Kast et al.
2016/0148826 A1 5/2016 Thallner
2016/0240420 A1 8/2016 Wagenleitner
(Continued)

FOREIGN PATENT DOCUMENTS

CN 111354714 A 6/2020
CN 111933618 A 11/2020
(Continued)

OTHER PUBLICATIONS

International Search Report from corresponding International Patent Application No. PCT/EP2021/286374, dated Jul. 21, 2022.
(Continued)

*Primary Examiner* — Michelle M Iacoletti
*Assistant Examiner* — Alexandria Mendoza
(74) *Attorney, Agent, or Firm* — RENNER, OTTO, BOISSELLE & SKLAR, LLP

(57) ABSTRACT
The invention relates to a method and a device for the alignment of a substrate.

14 Claims, 3 Drawing Sheets

(56) References Cited

U.S. PATENT DOCUMENTS

| | | | | |
|---|---|---|---|---|
| 2019/0198371 | A1 | 6/2019 | Wagenleitner et al. | |
| 2020/0219746 | A1* | 7/2020 | Yang | H10P 72/50 |
| 2020/0227299 | A1* | 7/2020 | Wagenleitner | H10P 72/53 |
| 2021/0151339 | A1 | 5/2021 | Wagenleitner et al. | |
| 2023/0290732 | A1 | 9/2023 | Ye et al. | |

FOREIGN PATENT DOCUMENTS

| | | | | |
|---|---|---|---|---|
| EP | 2 612 109 | B1 | 7/2013 | |
| EP | 3 011 589 | B1 | 4/2016 | |
| EP | 3 734 650 | A1 | 11/2020 | |
| JP | H11288867 | A * | 10/1999 | G03F 9/7076 |
| JP | 2005005444 | A * | 1/2005 | |
| JP | 2016503589 | A | 2/2016 | |
| JP | 2017162919 | A | 9/2017 | |
| JP | 2019530206 | A | 10/2019 | |
| WO | 03033199 | A1 | 4/2003 | |

OTHER PUBLICATIONS

Notification of Rejection Reasons issued in related Japanese Patent Application No. 2024-533271 dated Oct. 6, 2025.

* cited by examiner

Fig. 2a
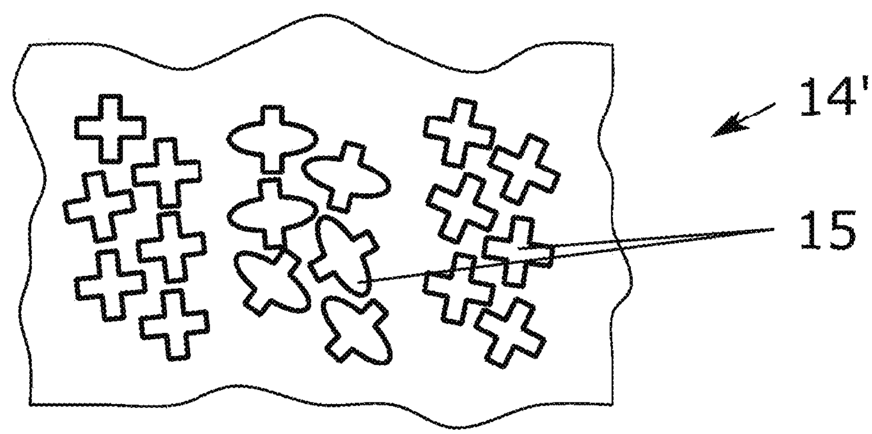
Fig. 2b
14"
16
16'
Fig. 3
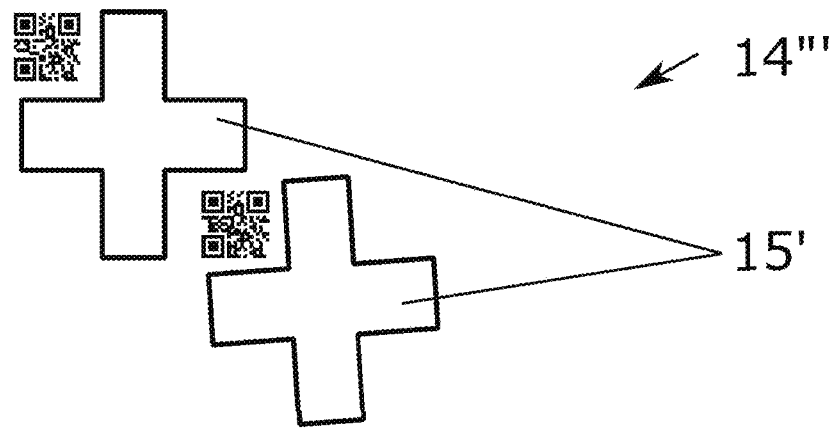

METHOD AND DEVICE FOR THE ALIGNMENT OF A SUBSTRATE

FIELD OF THE INVENTION

The present invention relates to a method and a device for the alignment of a substrate.

BACKGROUND OF THE INVENTION

In the semiconductor industry, alignment systems are used to align substrates, in particular wafers, with one another or with other components. Substrates can have any shape and are preferably round. The diameter of the substrates is in particular industrially standardised. For wafers, the industrially standard diameters are 1 inch, 2 inches, 3 inches, 4 inches, 5 inches, 6 inches, 8 inches, 12 inches und 18 inches. In special embodiments of the alignment systems, square substrates or panels can in particular also be aligned and bonded with one another with extreme accuracy.

The jointing of, in particular, aligned semiconductor substrates is referred to as bonding.

In so-called bonding, the substrates to be bonded are aligned with one another and bonded together in a further process step. A particularly precise alignment of the substrates with one another is thereby necessary.

Alignment processes, in which the alignment markings are located on the substrate surfaces to be bonded, are referred to as face-to-face alignments.

If at least one of the substrates is not transparent for electromagnetic radiation, which is used to measure the substrates, in order to enable detection and/or determination of the position and location of the alignment markings from the outer substrate surfaces facing away from the substrate surfaces to be bonded, alignment markings are detected in the prior art with image detection means between the substrates before the substrates are brought close to one another.

This has various drawbacks. In particular, particles from the camera can be introduced onto the substrate surfaces. Furthermore, a large distance has to be travelled between the substrates in order to position the camera between the substrates for the detection. Quite large alignment errors thereby arise due to the more complex alignment and the correspondingly greater travel distances.

Particularly in the mutual approach of the substrates to be bonded and the setting of a specific distance between the bonding surfaces, an optimum alignment is essential in order to obtain the best possible bonding result.

A further problem with the prior art consists in the fact that increasing alignment accuracy requirements can no longer be achieved with simple means. In respect of methods in which substrates are measured relative to reference points and for example after an approach are aligned blind up to the contacting, the new alignment accuracy requirements are not achieved.

For example, publication U.S. Pat. No. 6,214,692B1 is based on the comparison and the position correction of two images of alignment markings. The position of the alignment markings on the two substrates arranged face-to-face is detected individually by means of a camera system. From a calculated relative location and relative position of the alignment markings, a positioning table (substrate holder and stand) is steered in such a way that the mispositioning is corrected.

The further publication U.S. Pat. No. 10,692,747B2 is based on the comparison and the position correction of a total of three images of plane alignment markings. The position of the alignment markings on the two substrates arranged face-to-face is detected individually by means of a camera system. From a third detection unit, a third alignment marking is detected, with which a correction of an alignment mark of the substrate with respect to the rear side of the substrate holder or to the rear side of the substrate is produced, so that a more precise alignment of two substrates is enabled.

To this extent, a visual control in a face-to-face alignment of two substrates is not possible or is only possible if at least one of these substrates is at least partially transparent. A precise alignment of the surfaces with a face-to-face alignment, therefore, is only possible in a complicated and limited way.

In particular, it has been shown to be disadvantageous that a refocusing is necessary in a detection of alignment markings. This means that refocusing with adjustment movements, in particular of the optics for the detection of the alignment markings, is necessary as a matter of principle. Apart from the necessary movement, adjustment movements take place with parasitic movements superimposed on them, which cause deviations from the ideal movement of the respective optics. A movement thus leads to a displacement of the focal point. The focal point is for example displaced in the x-y plane extending normal to the optics or an optical axis of the optics. The displacement of the focal point reduces the accuracy of the measurement of the alignment markings, which reduces the alignment accuracy.

It is the aim of the present invention, therefore, to specify a method and a device for the alignment of a substrate, which at least partially remove, in particular completely remove the drawbacks listed in the prior art. It is in particular an aim of the invention to specify an improved method and an improved device for the alignment of a substrate. It is in particular an aim of the present invention to specify a method and a device for the alignment of a substrate which does not require any refocusing of a detection unit during alignment. Furthermore, it is an aim of the present invention to specify a method and a device for the alignment of a substrate, which can be carried out particularly reliably, precisely and free from contamination or which aligns particularly reliably, precisely and free from contamination.

SUMMARY OF THE INVENTION

The present aim is achieved with the features of the coordinated claims. Further advantageous developments of the invention are given in the sub-claims. All combinations of at least two features stated in the description, in the claims and/or the drawings also fall within the scope of the invention. In stated value ranges, values lying within the stated limits should also be deemed to be disclosed as limiting values and can be claimed in any combination.

Accordingly, the invention relates to a method for the alignment of a substrate with at least the following steps:

i) Provision of a substrate holder with a substrate holder surface designed for the mounting of the substrate and an alignment marking field arranged fixed with respect to the substrate holder, ii) alignment of the substrate, where the substrate is aligned with the aid of the alignment marks of the alignment marking field arranged one above the other.

The substrate or the substrate stack is aligned with the aid of alignment marks arranged one above the other. The alignment marking field is arranged fixed with respect to the substrate holder or to the substrate holder surface. In particular, the precise position of the alignment marking field and the respective position of the alignment marks in the alignment marking field relative to the substrate holder is known. The alignment marks or at least two alignment marks of the alignment marking field are arranged one above the other.

The arrangement of at least two alignment marks of the alignment mark field one above the other means that the latter are arranged in different planes. The alignment marking field thus has a specific height (z-direction) relative to the substrate holder surface. The at least two alignment marks are thus arranged in different z-planes from one another.

The alignment marks preferably do not conceal one another in the z-direction, so that the view of the at least two alignment marks of the alignment mark field can take place from a viewing direction unobstructed. In other words, the alignment marks of an alignment mark field are preferably offset with respect to one another, arranged above one another in planes parallel with one another, so that any alignment mark in any plane of the alignment marking field can be observed.

Furthermore, it is conceivable that the at least two alignment marks of the alignment marking field arranged one above the other in the z-direction are arranged partially or completely overlapping. In other words, the at least two alignment marks arranged one above the other can be arranged at least partially aligned with one another in the z-direction. In this case, the different z-planes or layers of the alignment marking field are in particular transparent for the different wavelengths, so that a further arbitrary alignment field in an arbitrary different plane of the alignment marking field can be detected. The planes/layers lying upstream in the viewing direction and/or the alignment marks lying upstream are penetrated for the viewing, so that the at least partially aligned alignment marks of a following plane can be detected.

With the detection of an alignment mark and a subsequent detection of an alignment mark arranged above the latter, the respective known position of the alignment marks can thus be compared. Since the nature and the structures and the positions of the alignment marking field are preferably known, the distance between the alignment marks can be detected. On the basis of this distance, an alignment with the aid of the alignment marks arranged one above the other can be carried out for example by a relative movement of the substrate holder, without a refocusing of detection means being required. In this way, a substrate can be aligned particularly precisely in at least one direction, since the known distance between the alignment marks arranged one above the other can be detected and can thus be set.

Furthermore, a bond gap can advantageously be very easily and exactly approached with the precise alignment in at least one direction. By means of a direct visual control, the substrate holder can advantageously be aligned in dependence on the alignment marking field. In addition, only one detection means is required for the alignment, as a result of which the susceptibility to error is reduced. In particular for the bonding of non-transparent substrates in a face-to-face method, therefore, a precise position of the substrate holder and thus of the substrate can advantageously be set. By means of the alignment marks arranged one above the other and the height information thus provided, an alignment can thus advantageously take place without refocusing of the detection means. The substrate to be aligned can thus be moved particularly precisely and under visual control over a specific distance.

In a preferred embodiment of the method for the alignment of a substrate, provision is made such that the alignment of the substrate includes at least the following steps in step ii), in particular in the following order:

a) detection of a first alignment mark in a first plane of the alignment marking field by a detection unit,
b) fixing of a focal position of the detection unit after the detection in step a),
c) movement of the substrate holder perpendicular to the first plane of the alignment marking field,
d) detection of a second alignment mark of a second plane of the alignment marking field by the detection unit, where the first plane and the second plane are arranged parallel to one another, and where the first plane and the second plane have a distance from one another.

A plurality of alignment marks are preferably arranged in the alignment marking field beside one another in the respective plane. At least one first alignment mark or at least one second alignment mark of the corresponding plane is thus detected. Furthermore, the alignment marking field is preferably constituted transparent between the planes for the detection unit, so that alignment marks arranged one above the other can be detected. It is also conceivable that the alignment marks of the first plane are arranged offset with respect to the alignment marks of the second plane and the alignment marking field has different gradations. In addition, apart from the respective first alignment mark, the detection unit can also detect further alignment marks of the first plane, as long as the latter are arranged in the focal range. The same then also applies to the second plane. The detection unit is constituted such that a plurality of alignment marks, in particular alignment marks arranged beside one another, of the respective plane can the detected.

In a detection of the first alignment mark on the first plane of the alignment marking field, the respective alignment mark is identified by the detection unit. The detection unit preferably includes focusing means, preferably a lens, which focuses sharply the first alignment mark in the detection. The detection unit or the lens occupies a focal position in which the detection unit can detect a specific focal range. The focal range of a specific focal position of the detection unit or of the lens is thus focused and alignment marks arranged inside the focal range can be detected. In a detection, only alignment marks of the respective plane can preferably be detected or identified, since a focal range in the detection unit in each case contains just precisely one plane. The distance between the first plane and the second plane is thus preferably greater than the depth of the focal range.

Following the detection of the first alignment mark of the first plane, the focal position of the detection unit is fixed. In particular, the focal range is thus fixed, so that the detection unit can subsequently preferably only detect alignment marks inside the fixed focal range. By a movement of the substrate holder normal to the first plane of the alignment marking field, the substrate on the substrate holder surface of the substrate holder is then jointly moved and thus aligned. The substrate holder is at least moved so far until the detection unit can detect the second alignment mark in the second plane of the alignment marking field. To this extent, by the movement of the substrate holder, the substrate is advantageously moved by the distance which is required for focusing. For example, a bond gap between the substrate and another substrate to be bonded can for example thus be set. Alignment errors on account of refocusing of the detection unit can thus advantageously be prevented.

In a preferred embodiment of the method for the alignment of a substrate, provision is made such that in step a) additional alignment marks on the substrate holder or on the substrate are detected by at least one additional detection unit.

The additional alignment marks or the additional alignment markings can advantageously be correlated with or placed in special reference to the position of the first alignment mark. The additional alignment markings are in particular a flat alignment marking field without alignment marks arranged above one another. In other words, these additional alignment markings are not arranged in planes above one another.

With the additional alignment markings, the alignment of the substrate holder relative to the alignment marks of the alignments marking field can advantageously also take place. Furthermore, an alignment of the substrate holder or of the substrate arranged on the substrate holder by means of the detection unit can also take place relative to the additional alignment markings. By means of the at least one additional detection unit, the position of an additional substrate to be bonded to the substrate relative to the alignment marking field can in particularly be determined. An alignment can take place still more precisely by the additional alignment marks and the additional detection unit.

In a preferred embodiment of the method for the alignment of a substrate, provision is made such that the detection unit in the focal position continuously misses alignment marking field during the movement of the substrate holder in step iv).

If further alignment marks are arranged in further planes between the first plane and the second plane, the latter can be measured by the detection unit during the movement of the substrate holder, so that the movement of the substrate holder can be carried out particularly precisely and in a controlled manner. Furthermore, the alignment can take place still more precisely by a plurality of detected alignment marks, the position of which in the alignment marking field is known.

In a preferred embodiment of the method for the alignment of a substrate, provision is made such that the detection unit is held fixed after the fixing of the focal position in step b).

The detection unit is fixed not only at a specific distance from the alignment marking field, but also in a horizontal position. The immoveable fixing relative to the alignment marking field thus also brings about in particular an immovable fixing in respect of the substrate holder and consequently of the substrate arranged on the substrate holder. In this way, it is advantageously ensured that, apart from the fixing of the focal position of the detection unit or of the lens, the position of the detection unit is also fixed. In this way, the substrate can be aligned still more precisely and an error in alignment on account of an imprecise movement of the detection unit is prevented.

In a preferred embodiment of the method for the alignment of a substrate, provision is made such that, in the detection of the first alignment mark in step a) and/or in the detection of the second alignment mark in step d) by the detection unit, information is additionally provided about the position of the respective alignment marks inside the alignment marking field.

The alignment marks preferably contain information regarding the respective position inside the alignment marking field. Apart from the position along alignment marking field (x-y-position), the respective height or the distance of the planes from one another is also known. If the first alignment mark is thus detected, it can advantageously be established in which plane it is arranged. Especially when the alignment marking field has more than two planes with different distances between them, the alignment can thus be controlled or regulated more easily, since the respective height information in respect to the alignment marks is detected. For example, in a continuous detection, it can advantageously be established during the movement or during the detection of the first alignment mark which plane or step is detected in the focal range. If in addition a position between two planes or steps is detected, a plane arranged above the latter or below the latter can advantageously be approached. Furthermore, the position can advantageously be detected and controlled in the x-y position.

The aforementioned advantages and features in respect of the method for the alignment are also intended to be disclosed in connection with the following device.

Furthermore, the invention relates to a device for the alignment of the substrate, at least including:

A) a substrate holder with a substrate holder surface designed for the mounting of the substrate, and B) an alignment marking field with alignment marks arranged fixed with respect to the substrate holder and/or to the substrate, where the substrate can be aligned with aid of alignment marks arranged one above the other.

The alignment marks of the alignment marking field arranged one above the other have in one direction of the alignment marking field a known distance from one another. In this way, the alignment of the substrate holder or of the substrate arranged on the substrate holder by a particularly precise detection means can advantageously take place solely with the aid of the alignment marks.

In a preferred embodiment of the device for their alignment of a substrate, provision is made such that the device further includes:

C) a detection unit for detecting the alignment marks of the alignment marking field, and D) a movement arrangement for moving the substrate holder, where the alignment marks of the alignment marking field are arranged in a first plane and second plane, and where the first plane and the second plane are arranged parallel with one another, and where the first plane and the second plane have a distance from one another, and where a first alignment mark of the alignment marks of the first plane can be detected in a focal position of the detection unit, and where the focal position of the detection unit can be fixed, and where a second alignment mark of the alignment marks of the second plane can be detected in the focal position by the detection unit, and where the substrate holder can be moved normal to the first plane by the movement arrangement.

The device is designed in particular such that the focal position of the detection unit can be fixed immediately after a detection of the first alignment mark of the first plane of the alignment marking field. The fixed focal position of the detection unit establishes the sharply defined focal range. In this way, the distance from the first plane to the second plane can advantageously be traversed by the movement arrangement, so that the substrate holder or the substrate can be moved exactly by the distance in one direction with the aid of the alignment marking field. In addition, the detection unit is also preferably held fixed, so that the distance between the planes can be traversed only by the detection of the alignment marks and a movement of the substrate holder.

When the device for the alignment is used for the setting of a bond gap between two substrates to be bonded, the distance between the first plane and the second plane is preferably the desired distance before the initiation of the bonding process. In other words, the bonding distance corresponds to the bond gap. The alignment with the device can advantageously be controlled directly by the detection of the second alignment mark of the second plane. A direct visual control through precisely one detection unit can thus advantageously verify a correct alignment.

In a preferred embodiment of the device for the alignment of a substrate, provision is made such that the alignment marks of the first plane and the alignment marks of the second plane are arranged aligned above one another, in particular congruent, in the alignment marking field.

The alignment marking field is preferably constituted transparent for the detection unit between the planes. By means of the aligned arrangement of the alignment markings above one another, it can advantageously be established when the second alignment mark is detected whether the movement of the substrate holder by the movement arrangement has been carried out exactly normal to the first plane. The detection unit has a focal point in the focal position, at which the respective position of the second alignment mark is comparable to the first alignment mark. Furthermore, it is conceivable for the alignment mark of the first plane to be rotated or mirrored with respect to the corresponding aligned alignment mark of the second plane. The alignment mark preferably does not have a point-symmetrical shape or outer contour, so that at least parts of the alignment mark can be detected by rotation or mirroring.

In a preferred embodiment of the device for the alignment of a substrate, provision is made such that the alignment marks of the first plane are arranged offset in a step-like manner with respect to the alignment marks of the second plane.

In this embodiment, the alignment marking field can itself be constituted step-like, where the planes comprising the alignment markings form a surface of the alignment marking field. In this case, the detection unit is preferably constituted in such a way that a plurality of steps of the alignment marking field can be detected without a relative movement. For example, the focal range of the detection means is so broad that a plurality of steps can be detected. It is also conceivable that the detection unit includes a plurality of means arranged beside one another in each case for the detection of a step. For example, the detection unit can include a plurality of optics arranged beside one another with corresponding lenses. In this case, the focal position of all the detection means of the detection unit is fixed after the detection of the first alignment mark. The alignment marking field is preferably constituted round and transfers between the planes circular. In other words, the planes comprising the alignment markings are annular, where the plane arranged in a centre is circular.

In this way, the detection unit can in each case advantageously detect the surface or an alignment mark of the alignment mark field arranged close to the surface.

In a preferred embodiment of the device for the alignment of a substrate, provision is made such that the alignment marking field is arranged on a rear side of the substrate holder facing away from the substrate holder surface.

The alignment marking field can for example be applied on the rear side or recessed into the substrate holder. In addition, the alignment marking field can also be formed by the substrate holder itself. Advantageously, the detection unit can be arranged on the rear side facing away from the substrate holder surface.

In a preferred embodiment of the device for the alignment of a substrate, provision is made such that a centre-point of the alignment marking field on the rear side of the substrate holder is aligned at least partially with a centre-point of the substrate holder surface.

By means of the central arrangement of the alignment marking field, the alignment of the substrate holder can advantageously be carried out precisely. In this embodiment, a linear error compensation or a rotation of the substrate holder and thus of the substrate holder surface relative to the detection unit can also advantageously be observed. In particular, wedge errors in respect of the lens of the optics can also be detected and removed. The alignment errors can be split up into error components. Linear, rotary and magnification errors and errors of a greater order of magnitude can thus be characterised.

In a preferred embodiment of the device for the alignment of a substrate, provision is made such that the alignment marking field is arranged on a side of the substrate facing towards the substrate holder surface.

In this embodiment, the substrate holder has a through-opening in the region of the alignment marking field. Furthermore, it is conceivable that the substrates holder is constituted transparent for the detection unit, so that the alignment marking field arranged on the substrate can be detected, in particular from the rear side of the substrate holder. In this way, visual control can advantageously take place directly at the substrate to be aligned. The substrate and thus the alignment marking field is held fixed relative to the substrate holder. For example, alignment errors on account of an uneven substrate holder surface are prevented. Furthermore, the alignment marking field can advantageously be adapted individually to the substrate.

In addition, the alignment marking field can be formed by the substrate or can be reproduced.

In a preferred embodiment of the device for the alignment of a substrate, provision is made such that the alignment marking field includes at least one further plane with the alignment marks, where the at least one further plane is arranged parallel with the first plane and the second plane.

Preferably, the alignment marking field has at least three planes with alignment marks. Information is provided on the alignment marks as to which plane the latter are arranged on. Furthermore, a plurality of specific distances can thus be traversed by the device. The distances between the planes can be of equal size. Preferably, however, the planes are arranged at different distances from one another. In this way, a plurality of distances can be traversed flexibly. Particularly when the device is used for bonding substrates, different bond gaps can thus advantageously be set or the substrate can be aligned particularly precisely with another substrate.

In a preferred embodiment of the device for the alignment of a substrate, provision is made such that the device includes at least one further alignment marking field and at least one further detection unit for detecting the at least one further alignment marking field, where the at least one further alignment marking field is arranged fixed with respect to the substrate holder.

The further alignment marking field permits a still more precise alignment, since the detection takes place at a plurality of points. For example, displacements and/or rotation errors are particularly well identified and removed. The alignment marking field and the at least one alignment marking field are preferably arranged offset along the substrate holder. Particular preferably, the device includes a total of three alignment marking fields and three detection units, which are each distributed around a centre-point of the substrate holder surface, in particular arranged uniformly offset with respect to one another in the radial direction.

The respective planes of the alignment marking field and the at least one further alignment marking field preferably have the same distances from one another. In this way, the alignment can take place particularly precisely, since the distance can be verified at at least two points, preferably locally offset points.

A core aspect of the invention is that, before an alignment of the substrate, the at least two alignment marks are detected on at least two different planes or heights of the alignment marking field. The alignment marking field is preferably affixed on one of the substrates to be aligned or on the substrate holder. The alignment marks each provide 3D position information for the alignment of the substrates. The alignment marking field is preferably not arranged on the contact surfaces of the substrates. The alignment marking field is preferably arranged on a side of the substrate or of the substrate holder facing away from the contact surface or arranged in parallel with the contact surface.

The alignment of the substrates with one another takes place in particular indirectly with the aid of alignment markings which are located on contact surfaces of the substrates. The alignment markings on opposite-lying sides of the opposite substrates are in particular complementary to one another. Alignment markings can be any objects which can be aligned with one another, such as crosses, circles or squares or propeller-like formations or grid structures, in particular phase gratings for the spatial frequency range.

In a particularly advantageous embodiment of the device, alignment markings can contain at least partially a QR code, which in particular describes an absolute, machine-readable position coding (x, y, z-position) of the respective alignment mark.

In a further particularly advantageous embodiment, alignment markings can contain at least partially alphanumeric characters, which in particular describe an absolute, machine-readable position coding (x, y, z-position) of the respective alignment mark.

The alignment markings and/or alignment marking fields are detected preferably by means of electromagnetic radiation of specific wavelength and/or wavelength ranges. These include for example infrared radiation, visible light or ultraviolet radiation. The use of radiation of shorter wavelength such as EUV (extreme ultraviolet radiation) or x-radiation is also possible.

A particularly important aspect of the present invention is that the alignment and setting of the bond gap takes place in particular exclusively by means of the detection of the alignment marks of the alignment marking field arranged one above the other. Exclusively is intended to mean that the additional alignment markings are not detected or detectable during the alignment. A bond gap can therefore be set precisely and under visual control by the alignment marks arranged one above the other.

The alignment marking field preferably contains unequivocally assigned and/or assignable alignment markings or alignment marks in at least two different planes. The alignment marking field includes steps or at least partially transparent layers, so that the alignment marks are arranged one above the other. Apart from the usual x-y position, height information is thus also indirectly provided. The alignment marks of the alignment markings also directly provide 3D position information. The height information is provided by the arrangement in different planes. Since the distances between the planes are known, the provision of the information as to which plane the detected alignment marks in the alignment marking field is arranged is thus in particular sufficient.

The alignment marking field thus includes position-coded and height-coded alignment marks, which deliver, without refocusing of the third detection unit, unequivocal position information and height information of the substrates and/or the substrate holder for the alignment. The alignment markings or the alignment marks of the alignment marking field should also be understood in the following without explicit mention of the height coding and/or the 3D position information as height-coded alignment markings or alignment marks.

The size or the dimensioning of the alignment marking field is preferably adapted to the respective field of vision of the optical detection means, so that in each case at least two steps or alignment marking planes can be observed.

The number of steps and the total height of the alignment marking field is also matched to the distance which is intended to be set. If for example a bond gap of 500 micrometres is to be set, 550 micrometres height-coded position information is preferably mapped in the alignment marking field, in order that the distance can be traversed without refocusing.

The detection takes place preferably with corresponding imaging optical systems, so that the depth of focus can be selected such that the latter is less than the step height or a layer thickness of the alignment marking field. The depth of focus (DOF) is the region of the image space of an imaging optical systems, in which a sufficiently sharp image of a focused object, in particular an alignment marking, arises. Conversely, this means that the image plane (image detection means, sensor) can be displaced in the range of the depth of focus, without the image object becoming distinctly unsharp.

If the detection of an alignment mark of the alignment marking field takes place with a small depth of focus, which is less than the step height, is preferably less than half the step height, particularly preferably less than 0.1 of the step height, the position of the alignment marking field can be unequivocally determined in particular in the z-direction.

The depth of focus of the detection means amounts to less than 50 micrometre, preferably less than 20 micrometre, particularly preferably less than 10 micrometre, very particularly preferably less than 5 micrometre, in the optimum case less than 4 micrometre.

If, on the other hand, the depth of focus is sufficient to form a sharp image of at least two step heights, the positioning uncertainty of the device is increased, because then an unequivocal assignment of a z-height to a step cannot take place.

In a preferred embodiment of the device, an image detection means or a detection means of the detection unit can be displaced by 0.2 step heights reproducibly without image-side refocusing. This can be used to determine which alignment marking of the alignment marking field is to be used for the positioning, if the image-side focal plane lies directly on the height of two adjacent steps and both steps appear equally sharp. With a small displacement of the image detection means, a decision (also as a computer-implemented, independent method according to the invention) can be made as to the alignment markings to be used.

In the detection of the alignment marking field, only one plane or step is imaged sharply for physical reasons. In this respect, only one step or plane preferably lies in the focal range of the detection unit. Since the alignment markings of the alignment marking field are position-coded and spatially-coded, position information in particular of the substrate holder in a spatial coordinate system can be determined from a sharply detected alignment mark of a plane.

According to an advantageous embodiment of the invention, the first substrate and the second substrate are arranged between the first substrate holder and the second substrate holder with a distance A between the first contact surface and the second contact surface in a Z-direction.

Distance A amounts in particular to less than 500 micrometres, preferably less than 100 micrometres, particularly preferably less than 50 micrometres, most preferably less than 10 micrometres.

A method for the alignment of a substrate is suitable for aligning at least two substrates with one another with arbitrary electromagnetic radiation, in particular with UV light, preferably with infrared light, most preferably with visible light. The substrate to be aligned or the substrate arranged on the substrate holder surface of the substrate holder can also be moved precisely relative to other components by the distance between the planes and can thus be aligned.

The method enables the observation or the detection of the first and second alignment markings, where supplementing with at least one additional optical path for the precise reproduction of the substrate position and substrate holder position is provided, which is not arranged or does not run between the substrates during the alignment of the substrates, but rather enables a detection from outside, in particular with the observation or detection of at least one alignment marking field. The alignment marking field provides the height information for the setting of a desired bond gap, preferably between the first plane and the second plane.

In particularly preferred method, a substrate can be non-transparent for electromagnetic radiation, which is used for the detection of the alignment marking of the first and second substrate. The detection of the alignment markings then takes place through the rear side of the substrate, which is transparent for electromagnetic radiation, which is used for the detection of alignment markings.

The method for the alignment increases the alignment accuracy in particular by means of the X-Y-Z location information and/or position information, which is detected with further alignment marking fields and corresponding further detection units and used for the control and/or regulation of the alignment.

For this purpose, the device for the alignment preferably includes, in particular, a software-supported control unit, by means of which the steps described here are carried out and components are controlled. Closed control loops and controls are understood to be subsumed under the control unit.

X- and Y-direction or X- and Y-position are understood to mean directions running or positions arranged in an X-Y coordinate system or in an arbitrary Z-plane of the X-Y coordinate system. The Z-direction is arranged orthogonal to the X-Y-directions. The X- and Y-direction corresponds in particular to a lateral direction, preferably along the planes of the alignment marking field. The Z-direction is preferably the direction in which the substrate holder is moved, when the focal position of the detection unit is fixed in the X-Y-plane.

Position features are calculated or detected from the position and/or location values of the alignment markings of the substrate and from the alignment markings on the substrate holder, in particular by the detection and evaluation of the alignment marking field.

The alignment marking field is preferably located in the local vicinity of the alignment markings of the substrates. Particularly preferably, at least one alignment marking of the substrates and the alignment marking field are arranged on opposite sides of the substrate. The alignment marking field can also be arranged on the rear side of the substrate holder and opposite the additional alignment markings. If the additional alignment marks and the alignment marks of the alignment marking field are arranged on opposite-lying sides of the substrate holder surface, a correlation of the position can particularly easily take place.

In a particularly preferred embodiment, at least one alignment marking field is preferably located in the z-direction aligned with the additional alignment markings of the substrates, preferably on a rear side of the substrate holder.

In a further preferred embodiment of the device, at least one alignment marking field is preferably located in the z-direction aligned with the centre of the substrate or with the centre-point of the substrate holder surface, in particular on a rear side of the substrate holder.

In a very particularly preferred embodiment of the device, two alignment marking fields are preferably located aligned in the z-direction with the additional alignment markings of the substrates, in particular on a rear side of the substrate holder.

In a further preferred embodiment of the device, at least one alignment marking field is located on the substrate side of the substrate holder or on the side of the substrate holder surface in the vicinity of the substrate, in a position accessible for the optical detection.

A further embodiment of the device contains at least two alignment marking fields on the substrate side of the substrate holder in the vicinity of the edge of the substrate, in a position accessible for the optical detection. A levelling of the substrate holder can thus advantageously be carried out.

The method for the alignment and the device for the alignment thus include in particular at least one additional detection unit with a corresponding measurement and/or control system and at least one additional alignment marking field, where the alignment accuracy can be further increased, in particular without refocusing, preferably without image-side refocusing, by additional measurement values and correlations with at least one of the measured values of the additional detection units.

The direct observability of an alignment mark and thus a real-time measurement and control during the alignment is enabled by the correlation of at least one of the measured additional alignment markings, in particular on the contact surfaces of a first substrate and/or a second substrate with at least one alignment mark of the alignment marking field, which is also freely accessible and visible during the alignment of the substrates. The alignment accuracy of the substrates is thus increased.

A further advantage of the alignment marking field is the detection of the additional height information, so that the lower substrate holder with the lower substrate can be positioned precisely with respect to the upper substrate on an upper substrate holder. In particular, the resulting position inaccuracies of the focusing movement of the detection unit are thus no longer present.

As a result of the increased accuracy of the height positioning of the distance from the upper substrate to the lower substrates during bonding, the pretensioning of at least one of the substrates is set with a small tolerance, which reduces the distortions of the substrate during bonding, so that the run-out of the substrates after the bonding is at least reduced, preferably eliminated. To this extent, the method for the alignment and the device for the alignment is predestined for an alignment in a bonding process.

In a further embodiment of the device, at least one further alignment marking field is positioned on the substrate side of a substrate holder close to the peripheral edge of the substrate in a position which is permanently accessible for a further detection unit. Particularly preferably, a surface of the alignment marking field is located in the same plane as the surface of the substrate fastened on the substrate holder and to be bonded.

Between the additionally added 3D position feature on the substrate holder and the position features on the substrate, an in particular unequivocal correlation is produced, which is preferably not changed during the alignment and is retained until the substrates are bonded together.

By means of the additionally added 3D position features on the substrate holder, which can be unequivocally correlated with the position features on the substrate, a direct observation of the alignment marking on the substrate can be replaced by a direct observation of the alignment markings on the substrate holder. The advantage of this is that the observable part of the substrate holder can almost always be arranged in the field of vision or in a detection area of a detection unit. By means of the 3D position information, the alignment of the substrates with one another can be carried out with increased accuracy.

The detection area of a detection unit preferably amounts to an area less than 3 mm×3 mm, preferably less than 2 mm×2 mm, particularly preferably less than 1 mm×1 mm.

An active feedback of the data of the positioning and position correction increases the accuracy compared to controlled positioning in the prior art, since the possibility of a control of the actual state of the position is provided in closed control loops.

An aspect of the method and the device for the alignment is the increase in the accuracy of the alignment of two substrates. With the method for the alignment, the alignment or movement can be observed, in particular from outside the bond interface in real-time. By means of the integrated 3D position information with the provided height information, alignment can be carried out more precisely than with previously known methods. The substrates are arranged in particular with a minimum distance from one another and no device object, in particular no detection unit, is preferably located between the substrates.

A correlation of the additional alignment markings of a first substrate and/or a second substrate on the respective contact surfaces of the substrates is produced with at least one alignment mark of the alignment marking field. The alignment mark of the alignment marking field can be detected during the alignment, in particular directly, by the detection unit.

The direct detectability or observability of the at least one alignment mark of the additional alignment marking field enables a real-time measurement of the 3D-position of the substrate holder. The alignment accuracy is increased, because with the detection of the first and the second alignment mark and the height information provided therewith, the positioning uncertainties cease to be present, as a result of which the error propagation is reduced. As a result of this measure, the alignment accuracy is improved by the reduction in the number of necessary feed movements and controlled height displacement during bonding.

A first embodiment of the device for the alignment is used in a bonding device and contains on upper substrate holder. An upper substrate can be fastened on the upper substrate holder. The upper substrate holder is constituted at least locally sufficiently transparent, so that the alignment markings of the upper substrate on the contact surface of the upper substrate, which is the surface facing away from the mounting surface of the upper substrate, can be detected with sufficient resolution and contrast and intensity.

For this purpose, the upper substrate is sufficiently transparent for the radiation which is used for the detection of a first additional alignment marking of the upper substrate.

A sufficiently transparent substrate is understood to mean that the transmittance of the substrate for electromagnetic radiation, with which the additional alignment markings are detected, is sufficient to detect the additional alignment markings in sufficient resolution and contrast and intensity.

A locally sufficiently transparent substrate holder is understood to mean that the transmittance of the substrate holder for electromagnetic radiation, with which the alignment marking is detected, is sufficiently high. Alternatively, viewing windows and/or through-openings can be provided for the observation of the substrate and/or substrate pairs in the substrate holder.

During the detection of the additional alignment marking on the substrates, the in particular upper substrate and the upper substrate holder are brought out of the focus of the additional detection unit.

Through the upper substrate holder and through the upper substrate, the additional alignment marking on the in particular lower substrate or on the lower substrate holder can be detected.

During the detection of the additional alignment marking, at least one alignment mark of the alignment marking field, in particular on the rear side of the substrate holder, is correlated in order to determine 3D position information of the substrate holder, in particular of the lower substrate holder. The detection unit for the detection of the alignment marking field is in particular part of an optical system for detecting the alignment marking field and, according to an advantageous embodiment, contains beam-shaping and/or deflection elements such as mirrors, lenses, prisms, radiation sources in particular for the Köhler illumination and image detection means such as cameras (CMOS sensors, or CCD, or area or line or point detection means such as a phototransistor) and movement means for the focusing as well as evaluation means for controlling the optical system.

In a further embodiment of the device, the optical system can be used in combination with a rotation system for the substrate positioning according to the principle of the turn-round adjustment (see in this regard Hansen, Friedrich: Justierung, VEB Verlag Technik, 1964, para. 6.2.4, Umschlagmethode). Accordingly, in the turn-round adjustment at least one measurement is carried out in a defined position of the respective substrate and at least one measurement in the oppositely orientated, turned-round position, rotated through 180 degrees. The measurement result thus obtained is in particular free from eccentricity errors.

A development of the device for the alignment contains two, in particular identical, structurally identical, optical systems with additional detection units which can be aligned with one another and can be fixed relative to one another for the detection of additional alignment marks.

In the further embodiment of the device for the alignment, at least one substrate holder is used, which at defined points is at least partially, preferably over 95% transparent for the in particular simultaneous observation of both substrate sides.

In a further embodiment of the device, at least one substrate holder is used, which includes openings and/or apertures and/or viewing windows at defined points for the in particular simultaneous observation of both substrate sides.

Furthermore, a device can contain a system for the production of pre-bonds. For the jointing of substrates, pins and/or adjustable nozzles can be used for the initiation of the fusion bond. In particular, the adjustable nozzles can be height-adjustable, so that the relative position with respect to the substrate rear side can be changed and the volume flow of the nozzle can be regulated adjustably. The alignment of the latter can advantageously take place with the aid of alignment markings arranged one above the other.

Furthermore, a device preferably contains movement arrangements with drive systems, guidance systems, restraints and measurement systems, in order to move, position and precisely align at least the detection unit and the substrate holder and therefore the substrate to be aligned.

The movement arrangements can produce any movement as a result of individual movements, so that the movement arrangements can preferably contain rapid rough positioning devices not meeting the accuracy requirements as well as precisely operating fine positioning devices.

A rough positioning device is understood to mean a positioning device when the approach and/or repetition accuracy deviates from the setpoint value by more than 0.1%, preferably more than 0.05%, particularly preferably more than 0.01%, relative to the total travel path or the rotation range, in the case of rotating rotation drives a complete revolution of 360 degrees.

For example, an approach accuracy of 600 mm*0.01%, i.e. more than 60 micrometre, as a residual uncertainty, thus results with a rough positioning device with a travel path of over 600 mm (twice the substrate diameter).

In another embodiment of the rough positioning, the residual uncertainty of the approach or repetition accuracy is less than 100 micrometre, preferably less than 50 micrometre, and particularly preferably less than 10 micrometre. Thermal disturbance variables should also be taken into account.

A rough positioning device performs the positioning task with sufficient accuracy only if the deviation in the traversing range of an assigned fine positioning device lies between the actually reached current position and the setpoint value of the position.

An alternative rough positioning device performs the positioning task with sufficient accuracy only if the deviation in half the traversing range of an assigned fine positioning device lies between the actually reached current position and the setpoint value of the position.

A positioning device is understood to mean a fine positioning device if the residual uncertainty of the approach and/or repetition accuracy does not exceed a setpoint value of less than 500 ppb, preferably less than 100 ppb, more preferably 1 ppb relative to the whole travel path or rotation range.

A fine positioning device will preferably compensate for an absolute positioning error of less than 5 micrometre, preferably less than 1 micrometre.

The alignment of the substrates with one another can take place in all six degrees of freedom of movement: three translations according to the coordinate directions x, y and z and three rotations around the coordinate directions. The movements can be carried out in any direction and orientation. The alignment of the substrates contains in particular a passive and an active wedge error compensation, preferably according to the disclosure in the publication EP2612109B1.

Robots for the substrate handling are subsumed as movement arrangements. The restraints can be structurally integrated or functionally integrated into the movement arrangements.

Furthermore, the device for the alignment of the detection unit preferably contains control systems and/or evaluation systems, in particular computers, in order to carry out the described steps, in particular to perform movement sequences, to carry out corrections, to analyse and store operational states of the device.

Methods are preferably drawn up as formulas and are constituted in machine-readable form. Formulas are optimised value collections of parameters, which are in a functional or process-related connection. The use of formulas permits a reproducibility of production operations to be guaranteed.

Furthermore, the device for the alignment according to an advantageous embodiment contains supply systems and auxiliary systems and/or supplementary systems (compressed air, vacuum, electrical energy, liquids such as hydraulics, coolants, heating media, means and/or devices for temperature stabilisation, electromagnetic shielding).

Furthermore, the device for the alignment can include a frame, cladding, vibration-suppressing or -damping or -absorbing active or passive subsystems.

Furthermore, a device for the alignment preferably contains at least one measuring system, preferably with measurement units for each movement axis, which can be constituted in particular as path measuring systems and/or angle measuring systems. The measuring system preferably includes at least one detection unit or an additional detection unit.

Tactile, i.e. touching, or non-tactile measuring methods can be used. The measurement standards, the unit of measurement, can be present as a physical-tangible object, in particular as a scale, or be present implicitly in the measurement method, such as the wavelength of the radiation used.

To achieve the alignment accuracy, at least one of the following measuring systems can be selected and used. Measuring systems implement measurement methods

- inductive methods and/or
- capacitive methods and/or
- resistive methods and/or
- comparison methods, in particular optical image recognition methods, detection of position marks and/or QR codes and/or
- incremental or absolute methods (with in particular glass standards as a scale, or interferometer, in particular laser interferometer, or with magnetic standards) and/or
- runtime measurements (Doppler methods, time-of-flight methods) or other time detection methods and/or
- triangulation methods, in particular laser triangulation
- autofocus methods and/or
- intensity measurement methods such as fibre optic range finders can in particular be used.

Furthermore, a particularly preferred embodiment of the device for the alignment contains at least one measuring system, which detects the X-Y-Z location and/or alignment position and/or angular position of at least one of the substrates and/or one of the substrates holders in relation to a defined reference, in particular to the frame. The measuring system includes at least one detection unit.

With the measuring system or with the detection unit of the measuring system, 3D positions of the substrate or preferably of the substrate holder are determined without refocusing, so that the height information can be determined from the measurement for the flat position data. In addition, at least one alignment marking field consisting of steps and/or layers is detected with unequivocal position markings.

A frame can be understood to be a part in particular made of natural hard stone or mineral cast or spheroidal graphite cast iron or hydraulically bound concrete, which in particular is set up vibration-damped and/or vibration-isolated and/or with vibration-absorption.

By attaching the detection units to the substrate holder and affixing the alignment marking field for example to the frame, a reversal of the idea can also advantageously be implemented. In this case, the detection unit is moved with the substrate holder and the alignment marking field is fixed on the frame.

In order that a detection, evaluation and control can take place at any point in time, in particular permanently, the alignment marks of the alignment marking field according to an advantageous embodiment are distributed on a larger area of the respective plane than the field of vision of an image detection system of the detection units, in order to supply the control unit (and/or regulation unit), in particular continuously, with measurement values. The alignment marks of the alignment marking field are configured, however, at each position of the field of vision of an image detection system, such that the height information can be detected from the alignment marking field and/or the extended planar position information. In other words, the spatial position of the substrate holder can be detected and the correct bond gap can be set at each lateral position of the substrate holder by the arrangement of the alignment markings of the alignment marking field. Since the position in particular of the substrate holder is present as 3D position information, a more precise spatial alignment of the substrates fastened thereon with respect to one another can be carried out.

In an advantageous embodiment of the device for the alignment, the additional alignment markings are distributed on the contact face of a substrate up to an edge zone (edge exclusion zone) of the substrate, in particular uniformly. In other words, therefore, the additional alignment markings of the substrate, which are positioned at a distance less than 3 mm, preferably less than 2 mm, particular preferably less than 500 micrometres from one another, can thus be used in order to carry out an alignment. Increased local alignment accuracies can in particular be achieved by the correlation of the additional alignment markings of the substrate with a spatially defined alignment marking field of a substrate holder.

For an X-Y-Z location determination, at least one three-beam interferometer with a correspondingly constituted, in particular monolithic, reflector for the detection of the X-Y-Z location and/or position determination of the substrate holder can also be used in the device for the alignment. In a possible further advantageous embodiment of a device, measurements can be made with a prismatic, monolithic reflector with a plurality of in particular three-beam interferometers. The error propagation can thus be eliminated by averaging, difference formation and measurement series formation and the alignment accuracy can be further increased. In other words, control systems for the trajectory of the movement can be used with sufficiently quick position measurements, so that position errors of the substrate holder can be further reduced.

The substrate holder of the device for the alignment, formed in particular from a monolithic block, preferably includes at least two of the following functions:

substrate fastening with vacuum (vacuum tracks, ports) and/or with electrostatic means, shape compensation for the deformation of the substrate by means of mechanical and/or hydraulic and/or piezoelectronic and/or pyroelectric and/or electrothermal actuation elements, position and/or location determination (measurement standards, reflection surfaces and/or prisms, in particular the reflectors for the interferometry, register marks and/or register mark fields, planar-constituted measurement standards for planes, volume standards, in particular steps, layer systems of known layer heights with alignment markings distributed in planes)

movement (guide tracks)

Movement arrangements, which are not used for the fine adjustment, are constituted in particular as robot systems, preferably with incremental linear encoders. The accuracy of these movement arrangements for auxiliary movements is decoupled from the accuracy for the alignment of the substrate stack, so that the auxiliary movements are carried out with lower repetition accuracy of less than 1 mm, preferably less than 500 micrometres, particularly preferably less than 150 micrometres.

The control and/or regulation of the movement arrangement of the device for the alignment for the (lateral) alignment (fine adjustment) is carried out in particular on the basis of the detected X-Y-Z locations and/or alignment positions. In addition, the additional alignment markings of the substrate are correlated with the alignment mark of the alignment marking field assigned uniquely thereto in the field of vision on the rear side of the substrate holder. The height information is calculated from the alignment marking of the alignment marking field. This gives an X-Y-Z location, which can be observed in particular continuously during the feed movement of the alignment and during the setting of the gap for the bonding and can be used in particular for the error correction of the feed movement in real time.

The accuracy of the movement arrangements for the alignment is less than 500 nm, preferably less than 100 nm, particularly preferably less than 50 nm, very particularly preferably less than 10 nm, more preferably less than 5 nm, most preferably less than 1 nm.

In a particularly preferred embodiment of the device, the error of the alignment accuracy of the device amounts to less than 20% of the permitted maximum alignment error, preferably less than 10%, most preferably less than 1%.

In other words, if the permitted alignment error of the substrates amounts for example to 10 nm, then the positioning error amounts to at most 20% of the value, i.e. 2 nm.

A first embodiment of an exemplary bonding method, which carries out the method for the alignment, includes in particular the following successively executed and/or simultaneously executed steps, particular in the following sequence:

First process step: The upper substrate is loaded with a mounting surface onto the upper substrate holder, where at least a first additional alignment marking is present on the opposite side, the so-called contact side of the upper substrate.

Second process step: The lower substrate to be aligned is loaded with a mounting surface on the lower substrate holder, where at least a second additional alignment marking is present on the opposite side, the so-called contact side of the lower substrate.

Third process step: At least the first additional alignment marking and, as the case may be, a further additional alignment marking of the upper substrate is detected through the upper substrate by an additional detection unit.

Fourth process step: The focal position of a lens of the additional detection unit is stored and the lens is fixed.

Fifth process step: The upper substrate is moved in particular upwards with the aid of the upper substrate holder in the direction of the additional detection unit, out of the focal plane. The traversing path preferably amounts to less than 500 micrometres.

Sixth process step: The lower substrate is moved in particular upwards with the aid of the lower substrate holder into the fixed focal position of the additional detection unit. In particular, wedge error compensation can also take place simultaneously.

In order to detect the second additional alignment marking on the lower substrate, the lower substrate is moved in the Z-direction with the aid of the lower substrate holder, until the contact side of lower substrate is focused.

Seventh Process step: a second additional alignment marking of the lower substrate is sought and detected by a second additional detection unit.

Alternatively, the lower substrate focused by the z-movement of the lower substrate holder is displaced in the X-Y plane or rotated around the Z-axis, so that the sought second additional alignment marking is positioned in the focal range of the first additional detection unit and is detected by the latter. The lower substrate is preferably further aligned, so that the sought alignment marking or the sought alignment markings are arranged in particular concentrically with respect to the optical axes of the fixed lens of the device.

In an advantageous embodiment, the sought alignment markings can be detected in a radius less than 3 millimetre, preferably less than 2 millimetre, particular preferably less than 1 millimetre, very particularly preferably less than 500 micrometre, still more preferably less than 250 micrometre in the vicinity of the optical axis of the respective lens of the detection units.

Eighth process step: By means of a measuring system with at least one detection unit for detecting alignment marks of an alignment marking field (in particular a measuring microscope with a lens), a first alignment mark of a first plane and thus an X-Y-Z location and/or alignment position of the lower substrate holder is detected preferably from the rear side of the substrate holder. The lower substrate holder is held fixed and the position or the positions of the additional alignment marking of the lower substrate is correlated with the detected position. In order to detect the position of the lower substrate holder, use is made of the alignment marking field arranged fixed with respect to the substrate holder.

A step of the alignment marking field is detected preferably focused, which lies close to the free surface of the alignment marking field, and alignment markings can be observed in the entire depth of the alignment marking field.

In this focused position, the focal position (in particular of the lens) of the detection unit is fixed for the detection of the alignment marking field. Furthermore, the detection unit is held locally fixed or immovable.

Ninth process step: The lower substrate is moved downwards by a defined distance by means of the lower substrate holder whilst measuring the alignment marks of the steps of different planes in the alignment marking field. The distance amounts to less than 500 micrometres. The distance by which the lower substrate is lowered is the so-called bond gap, i.e. the correct distance to be able to carry out a bond, especially a fusion bond and/or hybrid bond as distortion-free as possible.

In a particularly preferred embodiment of the exemplary method, the lower substrate is lowered with the lower substrate holder so far that an alignment mark of the closest step of another plane is focused in the alignment marking field. In this way, a blind or controlled movement of the substrate holder for alignment is avoided.

The movement of the lower substrate holder at least in the initial position and target position is detected with the detection unit, whereby the alignment marking field is observed in the different steps. At least one alignment mark of a first plane is detected in the initial position and at least one alignment mark of second plane of the alignment marking field is detected in the target position.

Tenth (optional) process step: the position of the lower substrate holder is corrected at least in the lateral plane by means of the measured position error. The substrate holder is moved in such a way that the corresponding at least one second alignment mark of the second plane is focused or lies in the focal range of the detection unit. In this way, it can be ensured by a visual control that the distance between the first plane and the second plane (i.e. the bond gap) has been set sufficiently precisely.

The refocusing of the detection unit can thus be dispensed with and alignment errors are prevented. Height information is provided by the alignment marking field, so that the desired bond gaps relevant for the process can be approached with visual control, without a blind movement. The focusing and/or the refocusing of the detection unit ceases to be present, so that the error in the focusing movement ceases to exist.

Eleventh process step: the upper substrate is lowered with the aid of the upper substrate holder back into the focal position of the additional detection unit or its lens.

Twelfth process step: with the aid of the correlated X-Y-Z location of the lower substrate holder, the upper substrate is aligned with respect to the lower substrate, the upper substrate preferably being moved in the X-Y plane and/or rotated around the Z-axis.

In this process step, the first additional alignment markings are aligned with respect to the second additional alignment markings. The actual position of the lower substrate on the lower substrate holder is known, because the correlated positions of the alignment markings of the lower substrate have been measured with respect to the alignment marking field, so that the alignment markings of the upper substrate can thus be aligned with respect to the known concealed position of the second alignment markings of the lower substrate.

Thirteenth process step: the lower substrate is raised for setting of the correct bond gap, whereby diverging movements can be observed and corrected with the aid of the alignment marking field.

Fourteenth process step: the contact surfaces of the upper and the lower substrate are contacted, the substrates are bonded with one another.

In the alignment of the substrates with one another, corrections can be carried out to their relative positions to on another, if the alignment errors exceed a fixed limiting value.

The alignment errors at which corrections are used for displacements are less than 500 micrometre, preferably less than 100 micrometre, particularly preferably less than 100 nanometre, very particular preferably less than 10 nanometre, still more preferably less than 5 nanometre, most preferably less than 1 nanometre.

The alignment errors at which corrections for rotations are used are less than 50 microradians, preferably less than 10 microradians, particular preferably less than 5 microradians, very particularly preferably less than 1 microradian, still more preferably less than 0.1 microradians, most preferably less than 0.05 microradians.

In a further embodiment of the method for the alignment, speeding up can be achieved by bringing the process steps into parallel, in particular the loading of the second substrate already being carried out during a pattern detection step on the first substrate.

The terms axes coincide or congruency or parallelism or normality are used in this publication as terms of magnitudes subjected to tolerances, so that in particular the tolerances apply as length dimensions or angular dimensions which are not tolerated according to ISO 2768, unless the tolerances are explicitly stated.

BRIEF DESCRIPTION OF THE DRAWINGS

Further advantages, features and details of the invention emerge from the following description of preferred examples of embodiment and with the aid of the drawings. The latter show diagrammatically:

FIG. 1 is a cross-sectional view of an embodiment of a device according to the invention, FIG. 2*a* is a plan view of an exemplary alignment marking field with alignment marks, FIG. 2*b* is a cross-sectional view of an embodiment of an alignment marking field, FIG. 3 is a plan view of an embodiment of an alignment marking field with alignment marks.

DETAILED DESCRIPTION OF THE INVENTION

Figure 4:
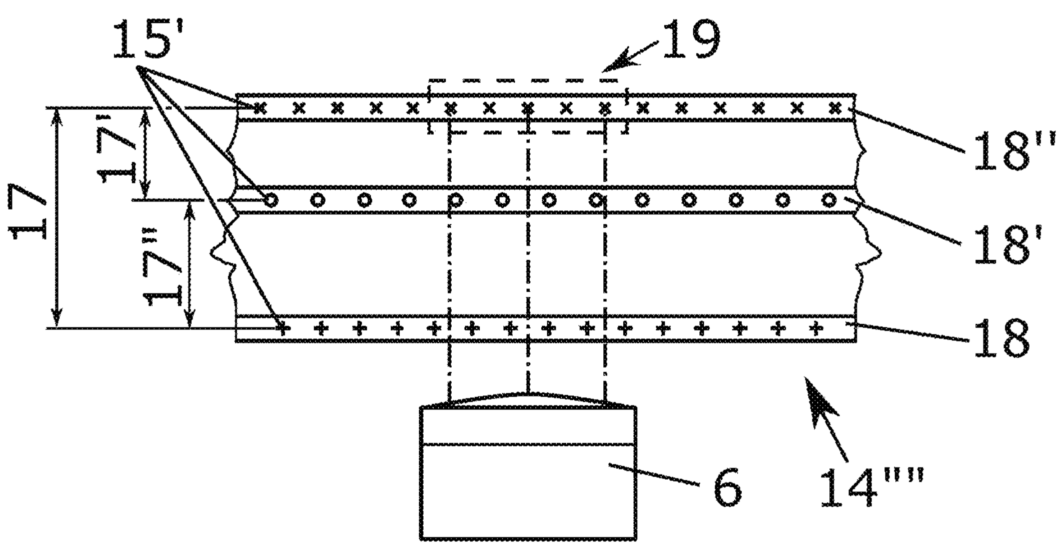
FIG. 4 is a cross-sectional view of an embodiment of an alignment marking field with a detection unit.

Advantages and features of the invention are denoted in the figures with the respective identifying reference numbers according to embodiments of the invention, where components or features with the same function or a function having the same effect are denoted with identical reference numbers.

Figure 1:
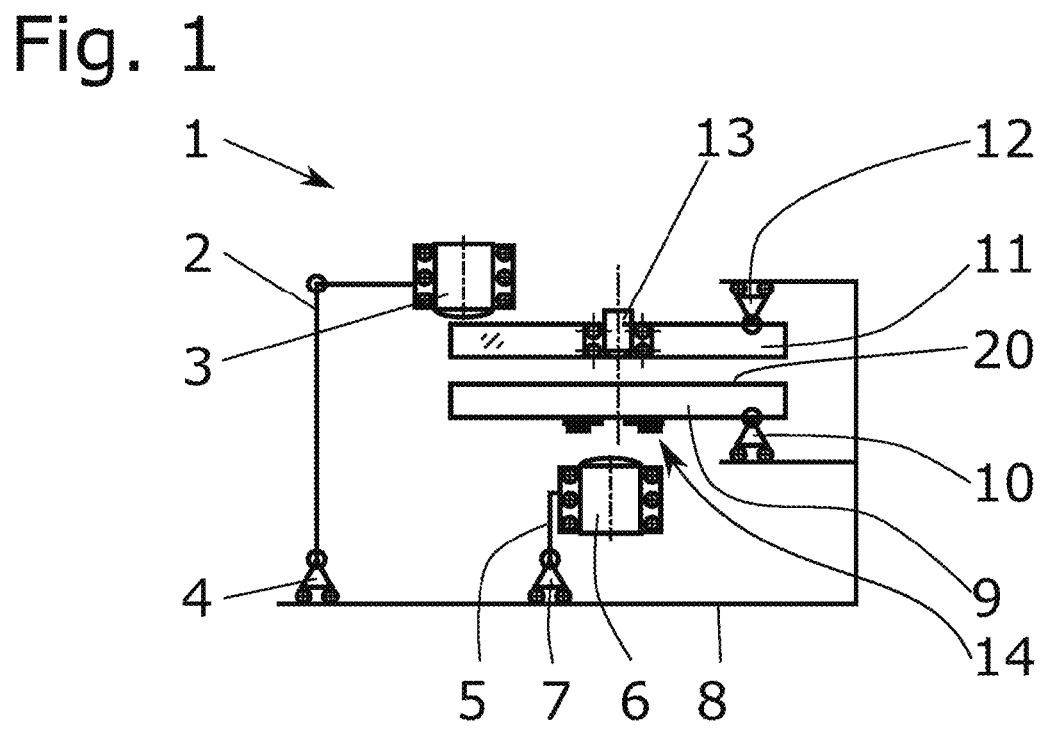

A functional representation, not true to scale, of the main components of an embodiment of an alignment system 1 is shown in FIG. 1. Alignment system 1 can align substrates (not shown in FIG. 1) with one another and bond the latter together at least partially and/or temporarily (so-called prebond). The terms device and system are equivalent and synonymous.

Alignment system 1 contains a first substrate holder 9, on which a first substrate can be loaded and fixed on a substrate holder surface. Furthermore, alignment system 1 contains a second substrate holder 11, on which a second substrate can be loaded and fixed.

The first, in particular lower, substrate holder 9 to be bonded is arranged on a first movement arrangement 10 for holding and implementing feed movements and adjustment movements (alignment) of first substrate holder 9. The second, in particular upper, substrate holder 11 is arranged on a second movement arrangement 12 for holding and implementing feed movements and adjustment movements (alignment) of second substrate holder 11. Movement arrangements 10, 12 are fixed in particular to a common, solid table or frame 8, in order to reduce/minimise vibrations of all functional components. The frame can in particular contain active vibration damping.

For the observation (detection) of additional alignment markings on the substrates, an optical system 2 of alignment system 1 contains at least one additional detection unit 3, in particular an image detection means, for detecting the additional alignment markings.

Optical system 2 can be focused on a focal plane or focal position, which is located between the first and second substrate, preferably between substrate holders 9 and 11, when these are arranged for the alignment. Movements of optical system 2, in particular in the X-, Y- and Z-direction, are carried out by means of a positioning device 4 for positioning optical system 2. Positioning device 4 can be fixed in particular on the solid table or frame.

At least one additional, in particular optical, measuring system 5 with at least detection unit 6 for detecting an alignment marking field 14 is used for increasing the alignment accuracy by detecting alignment marks on different planes of alignment marking field 14. A movement of the additional measuring system is carried out with a positioning device 7.

If it concerns an optical measuring system 5, the positioning device 7 can carry out focusing in respect of an alignment mark of first plane 18 of alignment marking field 14 by moving detection unit 6 in the Z-direction. Positioning in the X-Y direction is also conceivable, where in particular a fixing, preferably on the table/frame, takes place during the alignment.

In the represented embodiment of alignment system 1, measuring system 5 or detection unit 6 can detect in particular the X-Y location and/or position (in particular also the rotational position) and/or the height position of lower substrate holder 9 with particularly great accuracy.

For the initiation of a fusion bond, at least the upper substrate can be pretensioned with substrate pretensioning device 13. The pretensioning can take place by means of mechanical pretensioning with a pretensioning element, a so-called bond pin. In a further embodiment of the substrate pretensioning device, the pretensioning of the substrate can take place with a fluid, in particular with a gas from a nozzle, in particular from a mobile nozzle.

With embodiments of the device which are not represented, but preferred, the following process steps listed by way of example can be carried out:

The first/lower substrate is fastened on a first fixing surface, in particular the substrate holder surface, of first substrate holder 9. As a fastening, use is made in particular of mechanical and/or electrostatic clamping, pressing force, which is produced on account of a pressure difference between the surroundings in normal atmosphere and underpressure on first substrate holder 9, also known as a vacuum fixing. The fastening takes place in particular in such a way that the first substrate experiences no imprecise or undesired movement relative to first substrate holder 9 during the entire process. A thermal heat expansion can in particular be prevented or reduced, if first substrate holder 9 and the first substrate each have a corresponding, preferably linearly correspondingly running, thermal expansion coefficient, where the difference in the thermal expansion coefficients and/or the linear course of the thermal expansion coefficients preferably amounts to less than 5%, preferably less than 3%, particularly preferably less than 1%.

The system is preferably operated in a temperature-stabilised environment, in particular in a clean room, in which a temperature fluctuation amounts to less than 0.5 Kelvin, preferably less than 0.1 Kelvin, particularly preferably in less than 0.05 Kelvin, most preferably less than 0.01 Kelvin during an alignment cycle.

The fixed first substrate and first substrate holder 9 can be understood to be quasi-monolithic bodies for the performance of movements of the first substrate, which permit no relative movements with respect to one another.

This substrate fastening can take place in a form-fit manner and/or preferably friction-locked. As a result of the quasi-monolithic connection, the influences, which can bring about a displacement and/or rotation and/or deformation between the substrate holder and the substrate, are at least reduced, preferably at least reduced by an order of magnitude, particularly preferably eliminated.

With form-fitting or friction-locking, the substrate can be connected to the substrate holder in such a way that, in particular, the difference of a thermal expansion can be suppressed. Furthermore, the independent deformation of the substrate can be reduced, eliminated and/or corrected with the substrate holder.

In an embodiment, lower substrate holder 9 and also upper substrate holder 11 can contain additional passively and/or actively operated deformation elements and/or intermediate plates, in order to minimise the mechanical and/or thermal properties of the substrates for the reduction of the residual error of the alignment after the jointing.

First substrate holder 9 can be located in an optical path of additional detection unit 3 during the detection of a first additional alignment marking. The first additional alignment marking can be arranged on the contact surface of the first substrate to be bonded in the field of vision, in particular in the optical path, preferably in the optical axis of additional detection unit 3. Additional detection unit 3 produces an in particular digital image, which is measured. A first alignment marking of a substrate can also consist of a plurality of combined alignment markings.

From the image of the alignment marking, a measured value is produced/calculated, which in particular characterises the X-Y location and/or alignment position (in particular in the rotation direction around a Z-direction), i.e. the alignment state of a first substrate.

Lower substrate holder 9 and/or the first substrate include the alignment marks of alignment marking field 14, with the aid of which the X-Y-Z location and/or the alignment position, the spatial alignment state of substrate holder 9 and/or of the first substrate are detected in particular from another direction, preferably a direction lying diametrically opposite to the first detection in the Z-direction.

A relative movement of first detection unit 3 with respect to the third detection unit 6 can preferably be measured. Still more preferably, no relative movement between first additional detection unit 3 and detection unit 6 is performed from the detection of the first additional alignment marking and an alignment mark of alignment marking field 14 up to the contacting of the first and second substrate.

Detection unit 6 for the detection of alignment marking field 14 of additional measuring system 5 delivers a measured value of the spatial X-Y-Z location and/or position of first/lower substrate holder 9 from the measurement of the alignment marks of different planes of alignment marking field 14.

The measured values (X-Y location and/or alignment position of the first substrate and X-Y-Z location and/or alignment position of first substrate holder 9 or of the first substrate) are correlated with one another, so that the X-Y-Z location of substrate holder 9 can be recovered reproducibly. The substrate fastened on substrate holder 9 can be moved in a controlled manner for the alignment and for the setting of the bond gap, without the additional alignment markings of the substrate being able to be observed directly.

By assigning the position of the substrate to the spatial position and/or location of substrate holder 9, an alignment can be performed without direct observation of the X-Y locations and/or alignment positions of the respective substrate during the alignment and/or contacting. Furthermore, the distance between the substrates can be set in a defined manner and/or minimised during the alignment. The distance can preferably already correspond to the distance between the substrates during the detection of the first and second additional alignment markings. In other embodiments, the preferred distance for the bonding can be set.

In other words, an obstruction-free optical path between substrate holder 9 and additional measuring system 5 can in particular be provided, with which the alignment of the substrates can be operated or is operated in a control circuit. The X-Y-Z locations and/or alignment position of first substrate holder 9 and thus of the first substrate fixed on first substrate holder 9 can thus be precisely determined and recovered reproducibly, which in turn increases the accuracy in bonding, in particular fusion bonding.

The recovery and the correct setting of the X-Y-Z location and/or alignment position in particular of substrate holder 9 and in particular the substrate monolithically connected thereto with respect to the other substrate and/or substrate holder is an important aspect of the device for the alignment.

In particular, a repetition accuracy of the positioning (measured as a relative alignment error between the two substrates), also known as reverse play, of less than 500 nm, preferably less than 100 nm, particularly preferably less than 30 nm, very particularly preferably less than 10 nm, still more preferably less than 5 nm, most preferably less than 1 nm, is achieved. The reverse play can also be the repeated approach of a given position with the aid of the movement arrangements 10, 12 and/or 4, 7. The reverse play results from the movements of the movement arrangements, only the place of detection varies, so that the measurement magnitude exists as a relative alignment error.

For a further increase in the alignment accuracy, it is preferable to operate first additional detection unit 3 time-synchronised with second additional detection unit 5, in particular with a time difference of the detections of the measured values of less than 3 seconds, preferably less than 1 second, particularly preferably less than 500 milliseconds, very particular preferably less than 100 milliseconds, in the most preferred case less than 10 milliseconds, most preferably of all less than 1 millisecond, in the ideal case simultaneously. This is particularly advantageous, because the effect of interfering influences such as mechanical vibrations can be eliminated. Mechanical vibrations are propagated, amongst other things, with structure-borne noise with several thousand m/s in the materials. If a control and the detection means operate more quickly than the propagation speed of the structure-borne noise, an interference is reduced or eliminated.

If a disturbance changes the position of the first substrate on first substrate holder 9, so that first additional detection unit 3 has already recorded a measurement value and measuring system 5 with detection unit 6 for detecting alignment marking field 14 has still not picked up a measurement value, the disturbance can cause a share in the reduction of the accuracy of the alignment, because vibration-induced rapid mechanical position changes in the nanometre or micrometre order of magnitude can take place in the time between the measurement value recordings of additional detection unit 3 and detection unit 6. If the measurement value recording takes place with a time delay (in the order of magnitude of seconds or minutes), further interfering influences such as thermally-induced changes of shape or changes in length can also reduce the alignment accuracy.

If first additional detection unit 3 and detection unit 6 for detecting alignment marking field 14 are synchronised with one another (in particular by simultaneous triggering of the detection and the equalisation of the detection time and/or identical integration time for camera systems), some interfering influences can be reduced, in the optimum case eliminated, since the detection should take place at a point in time at which the interfering influences have as small an effect as possible on the detection accuracy.

In a preferred embodiment of the method and the device for the alignment, the detection will take place in a synchronised manner with known, in particular periodic interfering influences, in particular at the vertex of the vibration. In this regard, vibration sensors (acceleration sensors, interferometers, vibrosensors) can preferably be fitted beforehand at points of the device of relevance for the accuracy for alignment. The interfering influences are picked up by these vibration sensors and are taken into account or rectified by calculation, in particular by computer units, for the elimination. In a further embodiment, the vibration sensors can be fixedly installed at the characteristic points of the system.

In particular, a determined/fixed setpoint value is used for the alignment of the substrates. The setpoint value contains in particular image data of the alignment marks of alignment marking field 14 of first substrate holder 9 and/or the determined X-Y-Z location and/or the alignment position data for movement arrangement 10 of first substrate holder 9 and/or control parameters such as path curves for the optimum approach of the spatial position and/or in particular machine-readable values for the drives.

By means of first movement arrangement 10, first substrate holder 9 is moved and in a position- and in particular location-regulated manner until such time as the alignment error, which is calculated from the setpoint value of the detection unit and the current position and/or location of the substrate holder, is minimised, in the ideal case eliminated or a stopping criterion is reached. This movement of the lower substrate holder also contains the correctly set gap for the bonding, in particular the fusion bonding. In other words, lower substrate holder 9 is traversed in a controlled, regulated manner to the already known, measured X-Y-Z alignment position and moved in a regulated manner in particular in the Z-direction.

In further embodiments, residual errors, which could not be eliminated in the positioning of the upper and/or lower substrate, are also taken into account here as correction values for the positioning of the other (lower or upper) substrate.

FIG. 2*a* shows an alignment marking fields 14' in a diagrammatic, greatly enlarged plan view with alignment marks 15 or alignment markings 15 selected by way of example.

Individual alignment marks 15 represent symbolically and diagrammatically an absolute, unequivocal coding of the position and the location of each individual alignment mark or alignment marking 15. Individual alignment marks 15 or alignment markings 15 can be present in different planes of alignment marking field 14'. Since the nature (X-Y-Z location of each alignment marking 15) of alignment marking field 14' is known a priori, it suffices for the absolute position detection of the substrate holder (not represented) that an absolute coded alignment mark 15 or alignment marking 15 is detected.

FIG. 2*b* shows an alignment marking field 14" with different exemplary marked layers 16, 16' of alignment marking field 14" in a diagrammatic cross-sectional representation.

It is advantageous if, for the alignment of the substrate holder, which contains the alignment marking field or is arranged fixed with respect to the latter, a plurality of alignment marks of different planes are taken into account. In particular, a plurality of steps and/or layers 16, 16' of the alignment marking field can lie and thus be detected simultaneously or preferably successively in the field of vision or focal range of detection unit 6. By means of the known step heights or the known distances between the planes, the latter can be used for the alignment or setting of the desired gap between the substrates.

The distance between the planes amounts to between 1 micrometre and 300 micrometre, preferably between 5 micrometre and 200 micrometre, more preferably between 10 micrometre and 100 micrometre, in the optimum case between 25 micrometre and 75 micrometre, in the ideal case between 48 micrometre and 52 micrometre. The distance between the planes amounts to 50.00 micrometre in special cases.

It is advantageous if alignment marks 15, 15' of an alignment field 14, 14', 14", 14"' provide the spatial position and/or location of substrate holder 9 or of the substrate arranged on the substrate holder. In addition, it is advantageous if respective alignment marks 15, 15' contain detectable position information, which provides the respective position inside alignment marking field 14, 14', 14", 14"'. In particular, the position of the respective detected alignment mark 15, 15' with respect to alignment marks 15 of the alignment marking field is thus also known. Not only is the position of detected alignment mark 15, 15' with respect to alignment marks 15, 15' of the same plane preferably known, but also the position of the respective plane of detected alignment marks 15, 15' with respect to the other planes of the alignment marking field. This respective position information is enabled for example with different angles and different shapes of alignment markings 15, 15' and is represented diagrammatically by way of example.

For the precise setting of a desired gap or bond gap between the substrates, the optical system of a detection unit 6 for the detection of alignment marking field 14, 14', 14", 14"' should preferably have a smaller depth of focus or smaller depth of the focal range (in particular in the Z-direction) than half the distance between the corresponding planes.

FIG. 3 shows a possible embodiment of an alignment marking field 14"', wherein the individual exemplary alignment marks 15' are supplemented with a machine-readable code. Individual alignment marks 15 can be arranged on different planes (steps and/or layers) and can contain in the code information about which plane is concerned in each case. Furthermore, an unequivocal indication of the position and location of respective alignment mark 15' can be contained in the code.

In FIG. 4, an embodiment of an alignment marking 14"" is represented in a cross-sectional view. Alignment marks 15' of alignment marking field 14"" are arranged in three different planes 18, 18', 18" and can be detected by detection unit 6. Detection unit 6 can detect only alignment marks 15' inside focal range 19.

A first plane 18 has a known distance 17" with the respect to second plane 18'. Second plane 18' likewise has known distance 17' with respect to the third plane 18". In addition, distance 17 between first plane 18 and third plane 18" is known. Distance 17" and distance 17' are of different size in the represented embodiment, so that all three distances 17, 17' and 17" can be traversed or set when alignment marking field 14"" is used for the alignment of a substrate.

Combinations of distances 17, 17', 17" can also be traversed by multiple movement of the substrate holder 9 fixed with respect to alignment marking field 14"". For example, distance 17" can first be set and subsequently distance 17' can be traversed in the same direction. For example, the substrate holder can also be moved by twice distance 17". For this purpose, alignment takes place in two steps and the detection unit is correspondingly set between the steps, since a focal position and therefore focal range 19 of detection unit 3 is adapted.

LIST OF REFERENCE NUMBERS

1 a device for the alignment, alignment system
2 optical system
3 additional detection unit
4 positioning device
5 additional measuring system
6 detection unit (alignment marking field)
7 positioning device of the additional measuring system
8 frame
9 substrate holder, first substrate holder (to be aligned)
10 movement arrangement of the substrate holder to be aligned, first movement arrangement
11 second/upper substrate holder
12 second movement arrangement
13 substrate deformation device
14, 14', 14", 14'" alignment marking field
15,15' alignment marks, alignment markings
16, 16' layers of an alignment marking of an alignment marking field
17, 17', 17" distance
18, 18', 18" planes of the alignment marking field
19 focal range of the detection means in a focal position
20 substrate holder surface of the substrate holder (to be aligned)

What is claimed is:

1. A method for alignment of a substrate, comprising:
providing a substrate holder with a substrate holder surface designed for mounting of the substrate and an alignment marking field arranged fixed with respect to the substrate holder;
providing another substrate holder with another substrate holder surface designed for mounting of another substrate to be bonded to the substrate;
aligning the substrate to set a bonding distance between the substrate and the other substrate as a bond gap, comprising:
detecting a first alignment mark of a first plane of the alignment marking field by a detection unit;
fixing a focal position of the detection unit after the detecting of the first alignment mark;
moving the substrate holder normal to the first plane of the alignment marking field; and
detecting a second alignment mark of a second plane of the alignment marking field by the detection unit,
wherein the substrate is aligned using the alignment marks of the alignment marking field arranged one above the other,
wherein the first plane and the second plane are arranged parallel with one another, and
wherein a distance between the first plane and the second plane corresponds with the bond gap.

2. The method according to claim 1, wherein, during the detecting of the first alignment mark, additional alignment marks on the substrate holder or on the substrate are detected by at least one additional detection unit.

3. The method according to claim 1, wherein the detection unit in the focal position continuously measures the alignment marking field during the moving of the substrate holder.

4. The method according to claim 1, wherein the detection unit is held fixed after the fixing of the focal position.

5. The method according to claim 1, wherein, during the detecting of the first alignment mark and/or during the detecting of the second alignment mark, respective information about a position of the first alignment mark inside the alignment marking field and/or a position of the second alignment mark inside the alignment marking field is additionally provided.

6. A device for alignment of a substrate, comprising:
a substrate holder with a substrate holder surface designed for mounting of the substrate;
another substrate holder with another substrate holder surface designed for mounting of another substrate to be bonded to the substrate;
an alignment marking field with alignment marks arranged fixed with respect to the substrate holder and to the substrate;
a detection unit for detecting the alignment marks of the alignment marking field; and
a movement arrangement for moving the substrate holder,
wherein the substrate is aligned using the alignment marks arranged one above the other to set a bonding distance between the substrate and the other substrate as a bond gap,
wherein the alignment marks of the alignment marking field are arranged in a first plane and a second plane,
wherein the first plane and the second plane are arranged parallel with one another,
wherein a distance between the first plane and the second plane corresponds with the bond gap,
wherein a first alignment mark of the alignment marks of the first plane is detected in a focal position of the detection unit,
wherein the focal position of the detection unit is fixed,
wherein a second alignment mark of the alignment marks of the second plane is detected in the focal position by the detection unit, and
wherein the substrate holder is moved normal to the first plane by the movement arrangement.

7. The device according to claim 6, wherein the alignment marks of the first plane and the alignment marks of the second plane are arranged aligned one above the other in the alignment marking field.

8. The device according to claim 6, wherein the alignment marks of the first plane are arranged offset in a step-like manner with respect to the alignment marks of the second plane.

9. The device according to claim 6, wherein the alignment marking field is arranged on a rear side of the substrate holder facing away from the substrate holder surface.

10. The device according to claim 9, wherein a centre-point of the alignment marking field on the rear side of the substrate holder is at least partially aligned with a centre-point of the substrate holder surface.

11. The device according to claim 6, wherein the alignment marking field is arranged on a side of the substrate facing towards the substrate holder surface.

12. The device according to claim 6, wherein the alignment marking field comprises at least one further plane with the alignment marks, and wherein the at least one further plane is arranged at least parallel to the first plane.

13. The device according to claim 6, further comprising:

at least one further alignment marking field; and at least one further detection unit for the detection of the at least one further alignment marking field, wherein the at least one further alignment marking field is arranged fixed with respect to the substrate holder.

14. The device according to claim 7, wherein the alignment marks of the first plane and the alignment marks of the second plane are arranged congruent.

* * * * *